US011190207B2

(12) United States Patent
Yen

(10) Patent No.: US 11,190,207 B2
(45) Date of Patent: Nov. 30, 2021

(54) RECOGNITION OF SIMULTANEOUS KEY PRESSES IN KEYBOARDS

(71) Applicant: HEWLETT-PACKARD DEVELOPMENT COMPANY, L.P., Houston, TX (US)

(72) Inventor: ShihFeng Yen, Taipei (TW)

(73) Assignee: Hewlett-Packard Development Company, L.P., Spring, TX (US)

(*) Notice: Subject to any disclaimer, the term of this patent is extended or adjusted under 35 U.S.C. 154(b) by 733 days.

(21) Appl. No.: 16/076,106

(22) PCT Filed: Jun. 19, 2017

(86) PCT No.: PCT/US2017/038081
§ 371 (c)(1),
(2) Date: Aug. 7, 2018

(87) PCT Pub. No.: WO2018/236334
PCT Pub. Date: Dec. 27, 2018

(65) Prior Publication Data
US 2021/0218416 A1 Jul. 15, 2021

(51) Int. Cl.
H03M 11/14 (2006.01)
G06F 3/02 (2006.01)
G06F 3/023 (2006.01)
H01H 13/70 (2006.01)
H03M 11/00 (2006.01)
H01H 13/705 (2006.01)

(52) U.S. Cl.
CPC .............. *H03M 11/14* (2013.01); *G06F 3/02* (2013.01); *G06F 3/0238* (2013.01); *H01H 13/70* (2013.01); *H01H 13/705* (2013.01); *H03M 11/003* (2013.01)

(58) Field of Classification Search
CPC ........ H03M 11/14; H03M 11/003; G06F 3/02
USPC ..................................... 341/22, 26
See application file for complete search history.

(56) References Cited

U.S. PATENT DOCUMENTS 6,286,064 B1  9/2001 King et al.
6,538,582 B1* 3/2003 Lin ...................... H03M 11/003
                                                          341/22
(Continued)

OTHER PUBLICATIONS

"Anti-Ghost Keyboard Encoder", LeadingUI, Retrieved from Internet: http://www.leadingui.com/wp/?page_id=318ckattempt=1, 2017, 3 Pages.

(Continued)

*Primary Examiner* — Albert K Wong
(74) *Attorney, Agent, or Firm* — HP Patent Development

(57) ABSTRACT

The present subject matter relates to recognition of simultaneous key presses in a keyboard. The keyboard includes a first group of keys, which includes keys that are to be individually recognized when pressed simultaneously with at least one other key of the first group. Keys of a first sub-group of the first group are connected to key switches that are to be connected to general purpose input/output (GPIO) pins. Keys of a second sub-group of the first group are connected to key switches on at least one of mutually different columns and mutually different rows of a matrix of electrical interconnections. The second sub-group includes at least one key that is not a modifier key.

14 Claims, 5 Drawing Sheets

(56) References Cited

U.S. PATENT DOCUMENTS

| | | | |
|---|---|---|---|
| 7,375,655 B2* | 5/2008 | Lu | H03M 11/003 341/22 |
| 8,159,372 B2* | 4/2012 | Sherman | H03M 11/003 341/24 |
| 8,217,809 B2 | 7/2012 | Westhues et al. | |
| 8,284,080 B2* | 10/2012 | Ng | G06F 3/0446 341/26 |
| 2009/0096640 A1 | 4/2009 | Sherman | |
| 2010/0066567 A1* | 3/2010 | Dietz | H01H 13/702 341/22 |
| 2010/0097342 A1 | 4/2010 | Simmons et al. | |
| 2010/0277348 A1* | 11/2010 | Birch | H03M 11/20 341/22 |
| 2011/0006927 A1* | 1/2011 | Liang | H03M 11/003 341/22 |
| 2012/0044095 A1 | 2/2012 | Makovetskyy | |
| 2012/0050208 A1* | 3/2012 | Dietz | G06F 3/04166 345/174 |
| 2012/0062474 A1* | 3/2012 | Weishaupt | G06F 3/04182 345/173 |
| 2015/0057772 A1 | 2/2015 | Hsu | |
| 2015/0293695 A1* | 10/2015 | Schonleben | G06F 3/0412 345/173 |
| 2016/0034046 A1* | 2/2016 | Waddell | G06F 3/0237 345/173 |

OTHER PUBLICATIONS

Cheng et al., "Anti-Ghost Key Design for a Notebook Keyboard", IEEE, Retrieved from Internet: https://ieeexplore.ieee.org/document/7129339/, 2015, 4 Pages.

Ninja, "How Many Controls Can We Press At Once?", Pyra and Pandora, Retrieved from Internet: https://pyra-handheld.com/boards/threads/how-many-controls-can-we-press-at-once.44489/, 2009, 12 Pages.

Reynoso, "Keyboard Controller using MSP430", TI Designs: Reference Designs, Retrieved from Internet: http://www.ti.com/lit/ug/tidu521/tidu521.pdf, 2014, 55 Pages.

* cited by examiner

RECOGNITION OF SIMULTANEOUS KEY PRESSES IN KEYBOARDS

BACKGROUND

A keyboard includes a plurality of keys, each of which can be pressed for providing an input to a computing system connected to the keyboard. Sometimes, multiple keys on the keyboard are to be pressed simultaneously for providing an input to the computing system. For example, in some gaming applications, operating system commands, or short-out key combinations, multiple keys on the keyboard are to be pressed together for performing an action. The multiple keys that are pressed together are to be recognized individually for the appropriate action to be performed.

BRIEF DESCRIPTION OF DRAWINGS

The following detailed description references the figures, wherein.

DETAILED DESCRIPTION

Figure 1:
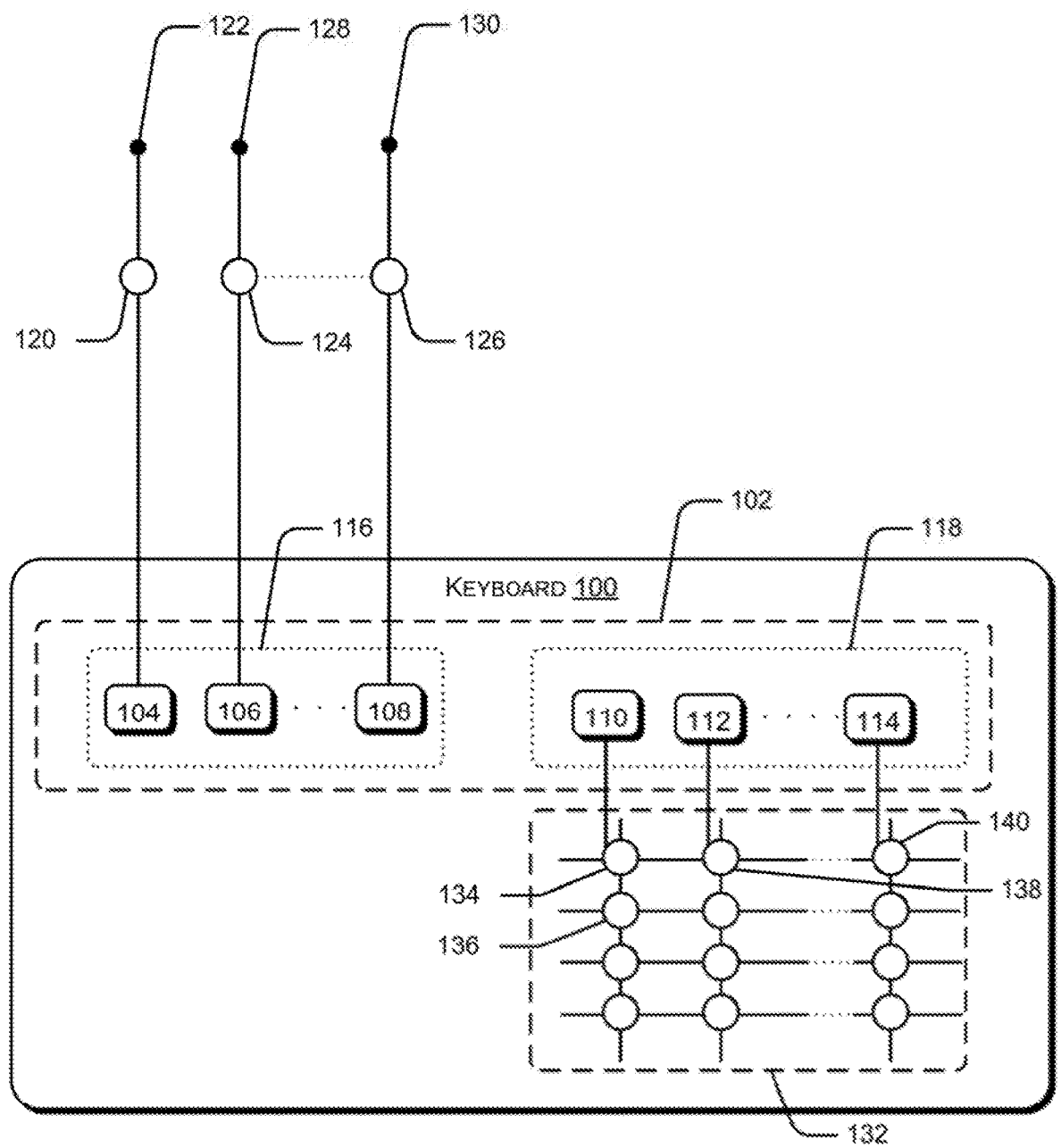
FIG. 1 illustrates a keyboard, according to an example implementation of the present subject matter.

A keyboard includes a plurality of keys, electrical interconnections arranged in rows and columns, and key switches at least some of the intersections of the rows and columns. Each key of the keyboard is connected to a key switch. When a key is pressed, its corresponding key switch is actuated, resulting in an electrical connection between the row and column corresponding to the key switch. This electrical connection results in the output of an electrical signal, which enables the recognition of the actuated key switch, and consequently the pressed key.

In some instances, multiple keys on the keyboard are to be pressed simultaneously for providing an input. For example, in a gaming application, three keys may have to be pressed at the same time for moving diagonally and dodging at the same time.

In some cases, when multiple keys are pressed simultaneously, some keys that are not pressed may be falsely recognized as pressed. For example, an electrical signal applied on a first column may travel to another column through keys pressed in the two columns. The electrical signal is transmitted through the pressed keys in the two columns to a row in which no key is pressed. This results in the non-pressed key being recognized as pressed.

To prevent false recognition of the pressed keys, in some keyboards, some key presses are not recognized when multiple keys are pressed simultaneously. This causes some of the actual key presses to go unrecognized, For example, when the keys 'Q' and 'W' are pressed, the pressing of 'A', "S", 'Z', or 'X' is not recognized. The phenomenon of false recognition of un-pressed as being pressed and some of the pressed keys being unrecognized to prevent the false recognition is referred to as "ghosting" of keys.

The present subject matter relates to recognizing simultaneous key presses on keyboards. With the implementations of the present subject matter, several keys of keyboards become "ghosting-free".

In accordance with an example implementation of the present subject matter, a keyboard includes keys and a matrix of electrical interconnections having rows and columns. Key switches are arranged at intersections of the rows and columns. The key switches help in recognition of key presses. The keys in the keyboard include a first group of keys, where each key of the first group is to be individually recognized when pressed simultaneously with at least one other key of the first group.

The fist group includes a first sub-group and a second sub-group of keys. The second sub-group includes at least one key that is not a modifier key, which is a key that modifies the action of another key when the keys are pressed at the same time. Each key of the second sub-group is connected to a key switch on the matrix, while each key of the first sub-group is connected to a key switch that is to be connected to a general purpose input/output (GPIO) pin of a controller. The keys of the second sub-group are connected to key switches on mutually different columns of the matrix. Alternatively, or in addition, the keys of the second sub-group are connected to key switches on mutually different rows of the matrix. Here, connecting keys to key switches in mutually different columns/rows refers to connecting the keys such that no two keys are connected to key switches on the same column/row.

In accordance with an example implementation of the present subject matter, a computing device includes a controller having a plurality of GPIO pins. The computing device also includes a keyboard. The keyboard, in turn, includes a keyboard matrix having key switches arranged in rows and columns, a first set of keys, and a second set of keys. Each key of the first set is connected to a key switch that is connected to a GPIO pin of the controller, while each key of the second set is connected to a key switch of the keyboard matrix. The second set includes a subset of keys. Each key of the subset is connected to key switches on mutually different columns of the keyboard matrix.

In accordance with a further implementation of the present subject matter, a method for providing electrical connections to keys of a keyboard to make selected keys anti-ghosting is described. The method includes connecting keys of a first set of keys to switches to be connected to GPIO pins of a controller and connecting keys of a second set of keys to switches of a keyboard matrix. The connection of the second set of keys includes connecting a subset of keys of the second set to switches on at least one of mutually different columns and mutually different rows of the keyboard matrix.

The present subject matter enables making several keys of keyboard individually recognizable even when they are pressed simultaneously. For instance, the keys that are connected to the GPIO pins are recognizable when pressed along with any number of other keys of the keyboard. Further, the keys that are arranged in the mutually different columns/rows are recognizable when pressed along with each other or with any key connected to the GPIO pins. Therefore, by connecting some keys to GPIO pins and rearranging connections of some other keys, several keys are made ghost-free without adding any new equipment, such as diodes, a membrane having different impedances for different keys, and the like, to the keyboard.

The following description refers to the accompanying drawings. Wherever possible, the same reference numbers are used in the drawings and the following description to refer to the same or similar parts. While several examples are described in the description, modifications, adaptations, and other implementations are possible. Accordingly, the following detailed description does not limit the disclosed examples. Instead, the proper scope of the disclosed examples may be defined by the appended claims.

Example implementations of the present subject matter are described with regard to computer keyboards. Although not described, it will be understood that the implementations of the present subject matter can be used with other types of keyboards as well, FIG. 1 illustrates a keyboard 100, according to an example implementation of the present subject matter.

The keyboard 100 includes a plurality of keys from which one or more keys can be pressed for providing an input to a competing device that includes the keyboard 100. A computing device that includes the keyboard 100 may refer to a computing device that physically includes the keyboard within itself (for example, a laptop computer) or a computing device that does not physically include the keyboard, but is connected to an external keyboard (for example, a desktop computer).

The plurality of keys includes a first group of keys 102. The first group of keys 102 may be interchangeably referred to as the first group 102. Each key of the first group 102 is to be individually recognized when pressed simultaneously with at least one other key of the first group 102. In an example, the first group 102 includes frequently used keys of the keyboard 100.

A key being individually recognizable means, that a press of the key is recognizable even when it is pressed at the same time as another key and that no un-pressed key is wrongly recognized as being pressed at that time. For instance, when a key 104 of the first group 102 is pressed at the same time as any other keys, say 106, 108, 110, 112, or 114, the press of the key 104 and that of the other keys is to be recognized individually and an un-pressed key is not to be falsely recognized as being pressed. The first group 102 includes a first sub-group of keys (first sub-group) 116 and a second sub-group of keys (second sub-group) 118. The second sub-group 118 includes at least one key that is not a modifier key, which is a key that modifies the action of another key when the keys are pressed at the same time. The modifier keys are explained in greater detail with reference to FIG. 2.

For recognition of the pressing of the keys of the first sub-group 116, each key of the first sub-group 116 is connected to a key switch that is to be connected to a general purpose input/output (GPIO) pin. For instance, the key 104 is connected to a key switch 120, which is to be connected to a GPIO pin 122. Similarly, the keys 106 and 108 are connected to key switches 124 and 126, respectively, which are to be connected to GPIO pins 128 and 130, respectively, Although not shown in FIG. 1, the key switches 120, 124, . . . , 126 may be included in the keyboard 100. The GPIO pins 122, 128, . . . , 130 may be included in a controller (not shown in FIG. 1) having a plurality of GPIO pins.

For recognition of the pressing of the keys of the second sub subgroup 118, each key of the second sub-group is connected to key switches on a matrix 132 of electrical interconnections, The matrix 132 of electrical interconnections includes electrical interconnections arranged in rows and columns. The matrix 132 includes key switches at intersections of the rows and columns of electrical interconnections. For example, the matrix 132 includes a key switch 134 at the intersection of the first row and first column, key switch 136 at the intersection of the first row and second column, and so on.

Each key of the second sub-group 118 can be connected to key switches in mutually different columns. Here, connecting keys to key switches in mutually different columns refers to connecting the keys such that no two keys are connected to key switches on the same column. For instance, as illustrated in FIG. 1, keys 110, 112, and 114, which are part of the second sub-group 118, are connected to key switches 134, 138 and 140, which are in mutually different columns.

Instead of, or in addition to, connecting the keys of the second sub-group 118 to key switches in mutually different columns, the keys of the second sub-group 118 can be connected to key switches in different rows of the matrix 132.

In an example, the keyboard 100 is a membrane type keyboard. In another example, the keyboard 100 is a mechanical type keyboard, in addition to the first group 102 of keys, the keyboard 100 can include a second group keys (not shown in FIG. 1) as well. Each key of the second group can be connected to key switch on the matrix 132. Further, the keyboard 100 can be contacted to a computing system. These and the other features of the present subject matter will be explained in the subsequent paragraphs.

It is to be understood that the key arrangement of the keyboard 100, illustrated in FIG. 1, is merely for the purposes of illustration, and any other arrangement of keys is possible and covered by the present subject matter.

Figure 2:
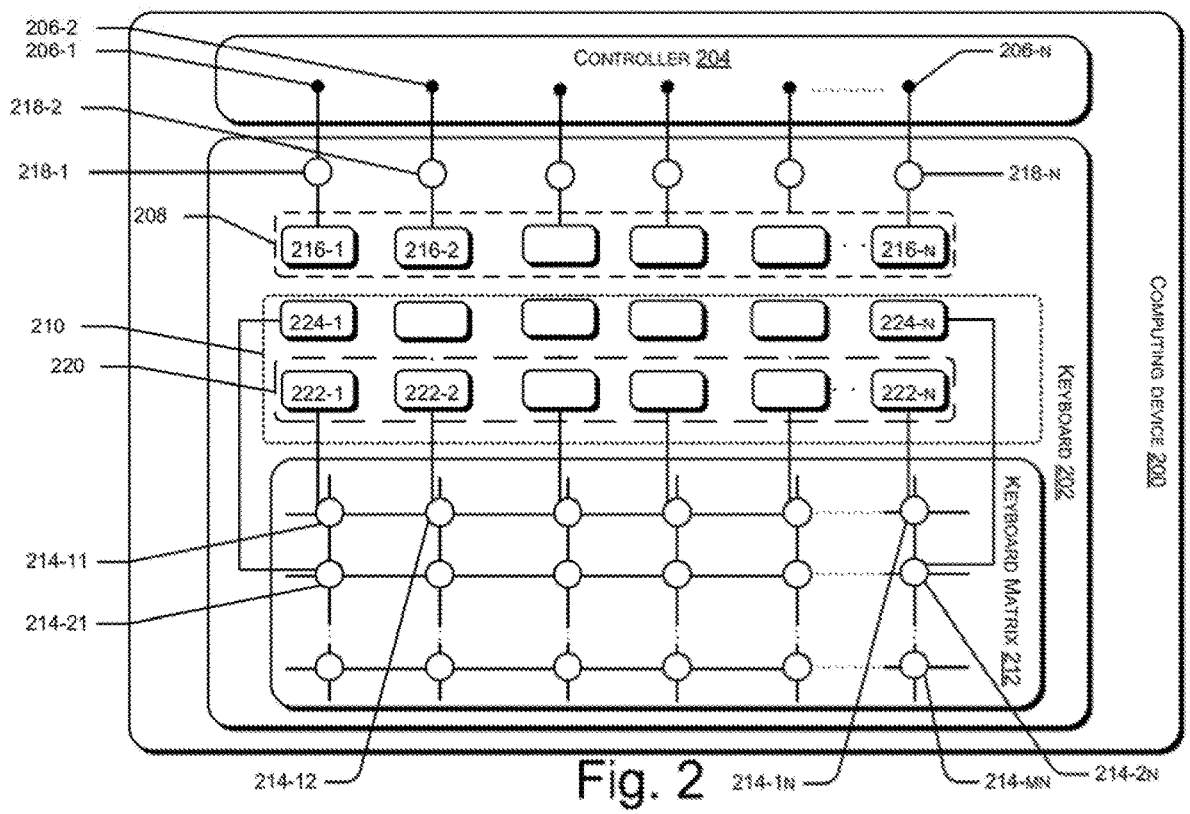
FIG. 2 illustrates a computing device connected to a keyboard, according to an example implementation of the present subject matter.

FIG. 2 illustrates a computing device 200, according to an example implementation of the present subject matter. Examples of the computing device 200 includes, but are not restricted to, laptop computer and a desktop computer.

The computing device 200 includes a keyboard 202 through which a user can provide inputs to the computing device 200 in the form of keystrokes. The keyboard 202 may be similar to the keyboard 100.

The computing device 200 also includes a controller 204 that includes a plurality of GPIO pins, such as GPIO pins 206-1, 206-2, . . . , 206-n. GPIO pins are generic pins, having no predefined purpose whose behavior can be controlled by users. The controller 4 may perform various functions with regard to the computing device 200. In an example, the controller 204 is an embedded controller (EC), which handles various tasks that the operating system does not handle, such as receiving and processing signals from the keyboard 202 and turning the computing device 200 on and off. In another example, the controller 204 is a keyboard controller, which interfaces between the keyboard 202 and the computing device 200. In a further example, the controller 204 is any other microchip.

The keyboard 202 includes a first set of keys 208, a second set of keys 210, and a keyboard matrix 212. The keyboard matrix 212 includes a plurality of key switches arranged in rows and columns. For instance, the keyboard matrix 212 includes key switches 214-11, 214-12, . . . , 214-1n, 214-21, . . . , 214-2n, 214-mn arranged in m rows and n columns. Although a key switch is shown to be present at each intersection of row and column, in an implementation, key switches may not be present in all the intersections.

Each key of the first set 208 is connected to a key switch that is connected to a GPIO pin of the controller 204. For instance, keys 216-1, 216-2, . . . , 216-n of the first set 208 are connected to key switches 218-1, 218-20 , 218-n, respectively, which, in turn, are connected to GPIO pins 206-1, 206-2, . . . , 206-n, respectively. Therefore, when any key of the first set 208 is pressed, its corresponding key switch, connected to a GPIO pin, is actuated, resulting in the output of an electrical signal from the GPIO pin. This enables recognition of the pressed key in the first set 208. The key switches 218-1, 218-2, . . . , 218-n can be included in the keyboard 202.

Further, each key of the second set 210 is connected to a key switch of the keyboard matrix 212. Therefore, when a key of the second set 210 is pressed, its corresponding key switch is actuated, establishing an electrical connection between the row and column corresponding to the key switch. This results in the output of an electrical signal, enabling recognition of the pressed key in the second set 210.

The second set 210 includes a subset of keys 220 also referred to as a subset 220. Each key of the subset 220 is to be individually recognized when pressed simultaneously with at least one other key of the subset 220. The subset 220 includes at least one key that is not a modifier key. A modifier key modifies the action of another key when the keys are pressed at the same time. Examples of the modifier key include, but are not restricted to, 'Shift' key, 'Ctrl' key, 'Alt' key, and <Windows> key. Such keys are defined by operating systems and are used in hotkey combinations, such as 'Alt+F4' and 'Ctrl+C'.

The connection of the keys of the second set 210 to the key switches of the keyboard matrix 212 is such that the keys of the subset 220 are connected to key switches in mutually different columns of the keyboard matrix 212. For instance, keys 222-1, 222-2, . . . , 222-n of the subset 220 are connected to key switches 214-11, 214-12, . . . , 214-1n, respectively, which are key switches on mutually different columns. The other keys of the second set 210 may be connected to remaining key switches of the keyboard matrix 212 in any fashion. For example, as illustrated, key 224-1 may be connected to the key switch 214-21 and key 224-n may be connected to the key switch 214-2n.

Although the keys of the subset 220 are shown to be connected to key switches on the first row of the keyboard matrix 212, it is to be understood that the keys, of the subset 220 can be connected to key switches on any of the rows.

Since the keys of the first set 208 are not connected to key switches of the keyboard matrix 212, the recognition of these keys is not affected by the pressing of any key of the second set 210. Further, since each key of the first set 208 is connected to key switches connected to mutually different GPIO pins, the pressing of multiple keys of the first set 208 at the same time can be individually recognized. Therefore, the keys of the first set 208 become globally "ghost-free", i.e., recognizable when pressed at the same time as any other keys of the keyboard 202.

Further, since the keys of the subset 220 are connected to key switches in mutually different columns, they can be individually recognized even when they are pressed simultaneously with each other. They can also be individually recognized when they are pressed at the same time as any key of the first set 208. Therefore, any key of the subset 220 is "ghost-free" relative to all the keys of the first set 208 and the other keys of the subset 220. In an implementation, the number of keys in the subset 220 is equal to the number of columns available in the keyboard matrix 212. This enables increasing the number of "ghost-free" keys of the keyboard 202.

From the above, it can be seen that, by connecting some keys outside the keyboard matrix 212 and connecting some other keys to key switches of different columns, several keys of the keyboard 202 are made ghost-free. Further, if the controller 204 is an EC or a keyboard controller, which are usually present in most computing devices and already include several GPIO pins, the present subject matter enables using the existing components of the computing devices to make keyboards ghost-free. Therefore, the techniques of the present subject matter make the keys of a keyboard ghost-free in an efficient and economical manner.

Although the keys of the subset 220 are explained as being connected to mutually different columns, in an implementation, the keys of the subset 220 may be connected to mutually different rows of the keyboard 202. Such a connection of the keys of the subset 220 also ensure that these keys can be individually recognized when pressed along with any other key of the subset 220 or with any key of the first set 208.

It may be understood that the first sub group of keys 116 corresponds to the first set of keys 208, the second sob-group of keys 118 corresponds to the subset of keys 220, and the second group of keys corresponds to second set of keys 210.

Figure 3:
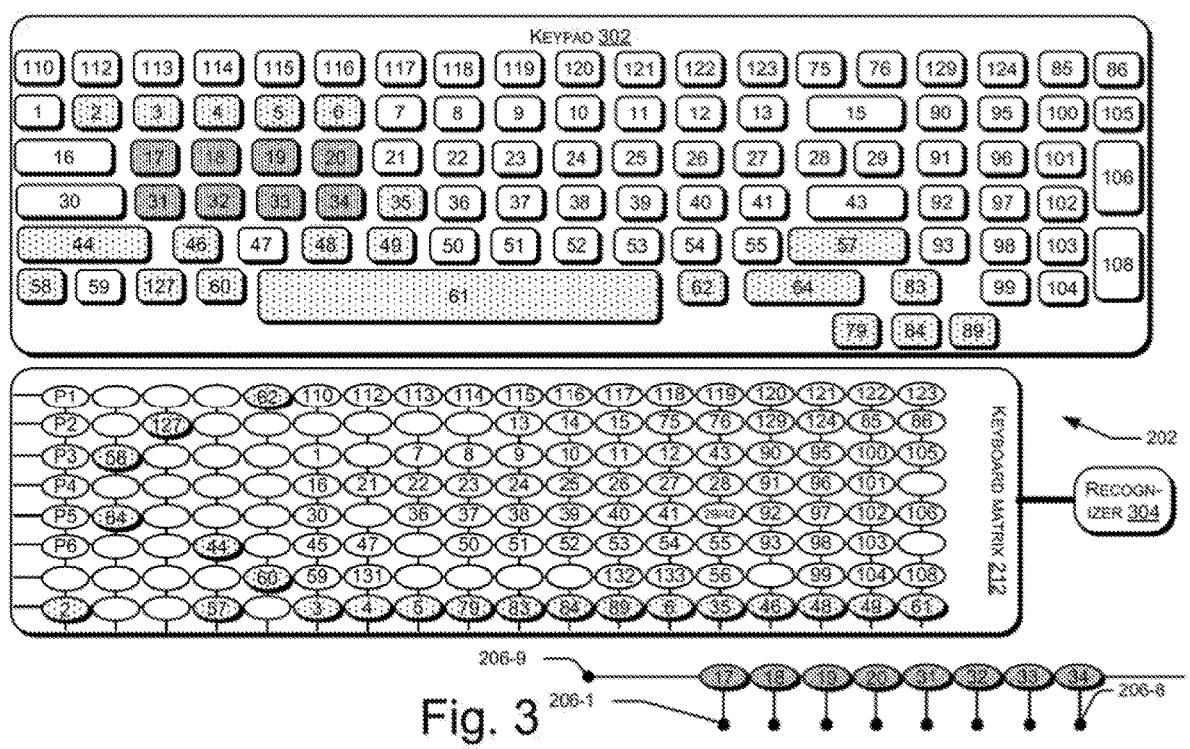
FIG. 3 illustrates connections of various keys of a keyboard to key switches of a keyboard matrix and key switches connected to a controller, according to an example implementation of the present subject matter.

FIG. 3 illustrates connections of venous keys of tie keyboard 202 to key switches of the keyboard matrix 212 and key switches connected to the controller 204, according to an example implementation of the present subject matter.

The keys of the keyboard are disposed on a keypad 302 and are connected to the key switches on the keyboard matrix 212 or the controller 204. The keyboard matrix 212 may be disposed beneath the keypad 302. In an implementation, the keyboard matrix 212 includes key switches arranged on eight rows and eighteen columns, as illustrated.

Each key of the keyboard 202 has key code associated with it. For example, the key code associated with the key 'Q' is 17 and the key '1' is 2. The key switch corresponding to each key on the keypad 302 is denoted by the key code of the key. For example, the key switch on the last row and the first column of the keyboard matrix 212 is denoted as '2' to indicate that it corresponds to the key '1', having the key code 2. Similarly, the left-most key switch in the controller 204 is denoted as '17' to indicate that it corresponds to the key 'Q', having the key code 17.

The keyboard 202 can also include one or more programmable keys P1-P6, which can be programmed for various purposes, such as for replacing another key, saving a macro, saving a shortcut for launching a p,program, saving a phrase of sentence, and the like.

It is to be understood that the present subject matter is not limited to the arrangement of keys and connections of keys to key switches illustrated in FIG. 3. Such an illustration is for the purposes of explanation alone, and any other manner of arrangement and connections of keys may be possible.

As explained earlier, keys of the first set of keys 208 are connected to key switches connected to GPIO pins of the controller 204. In an example, the keys of the first set 208 includes eight keys, which are 'Q', 'W', 'R', 'A', 'S', 'D', and 'F'. Therefore, these keys are connected to key switches connected to GPIO pins 208-1, 206-2, . . . , 206-8. These key switches are denoted as '17', '18', '19', '20', '31', '32', '33', and '34', indicating the key codes of their corresponding keys. These key switches correspond to the key switches 218-1, 218-2, . . . , 218-n. These key switches may be included in the keyboard 202.

Although the controller 204 is shown to include eight GPIO pins, it is to be understood that the controller 204 may include any number of GRIO pins. Further, it is to be understood that not all of the GPIO pins of the controller 204 may be used for connecting keys of the keyboard. In an example, the controller 204 includes 144 GPIO pins, and eight of them are connected to key switches connected to keys of the keyboard. In addition to the eight GPIO pins used for key recognition, an additional GPIO pin 206-9 may be used for providing a driving electrical signal for recognition of the pressing of the keys of the first set 208. When a key, say 'Q', of the first set 20 is pressed, its corresponding key switch, denoted as '17', is actuated, resulting in the flow of an electrical signal from the GPIO pin 206-9 to the GPIO pin 206-1. The flow of the electrical signal on the GPIO pin 206-1 results in recognition of the pressing of the key 'Q'. It will be understood that when n number of keys are included in the first set 208, n+1 number of GPIO pins are used for recognition of the key presses.

As explained earlier, keys of the subset of keys 220 can be connected to key switches in mutually different columns of the keyboard matrix 212. Here, the keys of the subset 220 includes eighteen keys, each key corresponding to one column of the keyboard matrix 212. In an example, the keys of the subset 220 are '1', '2', '3', '4', '5', 'G', 'C', 'Ctrl', 'Alt', 'Shift', <Windows>, <Left Arrow>, <Right Arrow>, <Up Arrow>, <Down Arrow>, and <Space>keys. Therefore, these keys are connected to key switches connected to mutually different columns. For example, the key '2' is connected to the key switch on the last row and the sixth column of the keyboard matrix 212, denoted by '3', the key code for key '2'. As can be seen, no other key of the subset 220 is connected to a key switch on the sixth column.

The connection of eight keys to key switches connected to GPIO pins and connection of eighteen other keys to key switches in eighteen mutually different columns enables making twenty-six keys ghost-free. Overall, it is to be understood that connecting X number of keys to GPIO pins and number of keys to mutually different columns makes X+Y keys ghost-free (X global ghost-free keys and each of the Y keys ghost-free relative to the other. X+V−1 keys).

In an implementation, the keys included in the first set 208 and second set 210 are selected based on the frequency of usage of the keys of the keyboard 202. For example, the most frequently used X keys of the keyboard 202 may be selected as part of the first set 208. Further, the second set 210 may include the next Y most frequently used keys. In another example, the second set 210 may include the Y keys that are most frequently used in combination with the X keys that are part of the first set 208. Still further, in an implementation, the keys may be included in the first set 208 or the second set 210 based, on the frequency of their use in some applications. For example, the keys may be chosen as part of the first set 208 or the second set 210 based on their use in gaming applications. It is to be understood that any criterion can be used to choose the keys that form part of the first set 208 or the second set 210.

In an implementation, the keyboard matrix 212 can be connected to a recognizer 304 for recognition of the pressed key. The recognizer 304 can be, for example, a keyboard controller. In an implementation, the recognizer 304 is same as the controller 204. In another implementation, the recognizer 304 is separate from the controller 204.

Figure 4:
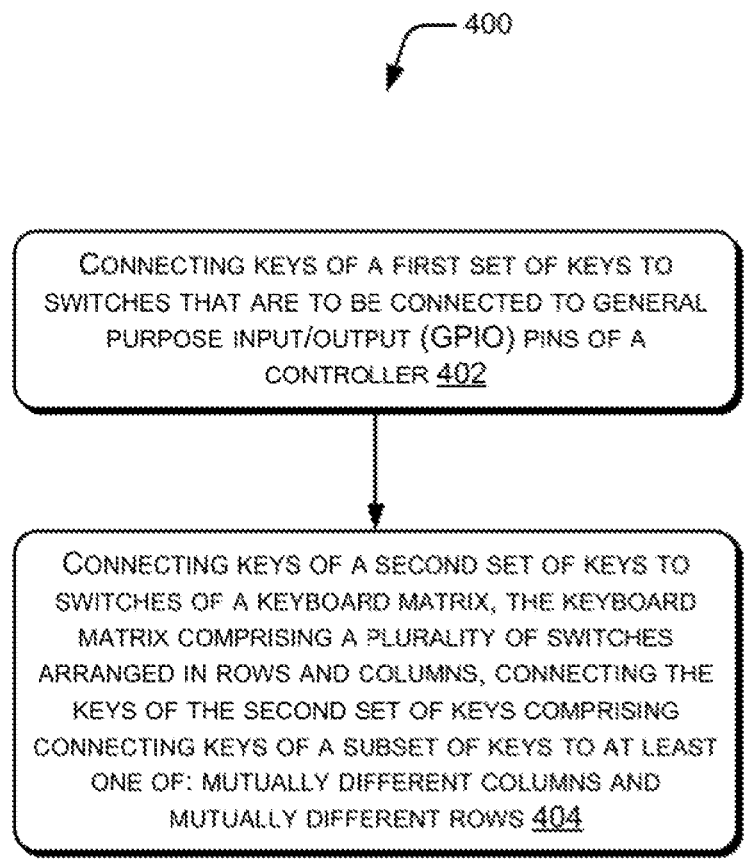
FIG. 4 illustrates a method for providing electrical connections to keys of a keyboard, according to an example implementation of the present subject matter.

For output of an electrical signal when a key connected to the keyboard matrix 212 is pressed, in an implementation, an electrical signal, such as a voltage signal may be provided to columns of the keyboard matrix 212. The electrical signal may be received by a row of the keyboard matrix 212 when a key switch in that row is actuated. For example, when the <space> key (key code 61) is pressed, the key switch corresponding to it, in the last row and last column of the keyboard matrix 212 is actuated. This can result in the flow of electrical signal from the last column to the last row, enabling recognition of the pressing of the <space> key. It is to be understood that such a technique of recognition of key connected to the keyboard matrix 212 is an example alone, and any other technique for recognition of the pressed key can be used, FIG. 4 illustrates a method 400 for providing electrical connections to keys of a keyboard, according to an example implementation of the present subject matter.

The order in which the method 400 is described is not intended to be construed as a limitation, and any number of the described method blocks may be combined in any order to implement the method 400, or an alternative method.

At block 402, keys of a first set of keys are connected to switches that are to be connected to GPIO pins of a controller. Any known technique for connection of keys to switches may be used for the connection. The first set of keys may be, for example, the first sub-group of keys 118 or the first set of keys 208. The switches may be, for example, the key switches 120, 124, 126, 218-1, 218-2, . . . , 218-n. The controller may be, for example, the controller 204. The GPIO pins may be, for example, the GPIO pins 122, 128, 130, 206-1, 206-2, 206-n. The method 400 can include connecting the switches that are to be connected to the GPIO pins to the GPIO pins.

At block 404, keys of a second set of keys are connected to switches of a keyboard matrix. The keyboard matrix includes a plurality of switches arranged in rows and columns. The second set of keys may be, for example, the second set of keys 210 of the second group of keys. The keyboard matrix can be, for example, the matrix 132 or the keyboard matrix 212. The switches of the keyboard matrix can be, for example, the key switches 134, 136, 138, 140, . . . , or 214-11, 214-12, . . . , 214-nm.

The second set of keys includes a subset of keys. A simultaneous pressing of at least two keys of the subset of keys is to be individually recognized. The subset of keys can be, for example, the second sub-group of keys 118 or the subset 220. The subset of keys includes at least one key that is not a modifier key, such as the 'Ctrl' key, 'Alt' key, and <Windows> key.

The connection of the keys of the second set includes connecting keys of the subset to switches on mutually different rows and/or mutually different columns of the keyboard matrix.

In an implementation, the method 400 can include connecting the keyboard matrix to a recognizer, such as the recognizer 304, for recognition of the pressed keys.

In an implementation, the keys of the first set and the subset are keys that are frequently used in gaming applications. Further, the modifier key may be an operating system-defined key for use in hotkey combinations.

Figure 5:
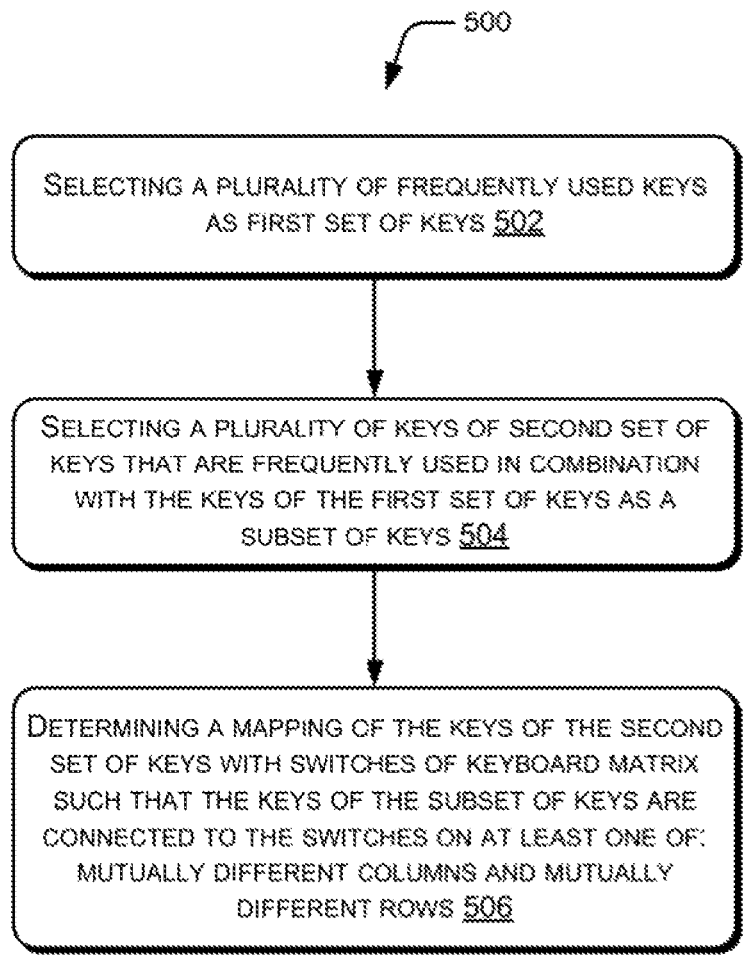
FIG. 5 illustrates a method for providing a mapping for keys of a keyboard with key switches on a keyboard matrix, according to an example implementation of the present subject matter.

FIG. 5 illustrates a method 500 for providing a mapping for keys of the keyboard with key switches on the keyboard matrix or the controller, in accordance with an implementation of the present subject matter.

The order in which the method 500 is described is not intended to be construed as a limitation, and any number of the described method blocks may be combined in any order to implement the method 500, or an alternative method. Furthermore, the method 500 may be implemented by processor(s) or computing device(s) through any suitable hardware, non-transitory machine readable instructions, or a combination thereof.

It may be understood that steps of the method 500 may be performed by programmed computing devices and may be executed based on instructions stored in a non-transitory computer readable medium. The non-transitory computer readable medium may include, for example, digital memories, magnetic storage media, such as one or more magnetic disks and magnetic tapes, hard drives, or optically readable digital data storage media.

Referring to method 500, at block 502, a plurality of frequently used keys is selected as the first set of keys. The plurality of frequently used keys may be, for example, the most frequently used keys in a gaming application.

At block 504, a plurality of keys of the second set of keys that are frequently used in combination with the first set of keys is selected as the subset of keys. The number of the keys of the second set that are selected as the subset of keys may be determined based on the number of columns in the keyboard matrix if the keys of the subset are to be connected to mutually different columns. If the keys of the subset are to be connected to mutually different tows, the number of keys of the second set that are selected as the subset of keys may be determined based on the number of rows in the keyboard matrix.

At block 506, a mapping is determined between the keys of the second set and the switches of the keyboard matrix. The mapping may be determined such that the keys of the subset are connected to the switches on at least one of mutually different columns and mutually different rows. In an example, such a mapping may be established by first mapping the keys of the subset to mutually different rows and/or mutually different columns and mapping the remaining keys of the second set to the remaining key switches.

The present subject matter provides an efficient technique for providing ghost-free keys in a keyboard, Since a subset of the keys of the keyboard alone are connected to GPIO pins, the present subject matter utilizes a minimal number of GPIO pins to achieve ghost-free keys. Further, since the remaining keys of the keyboard are connected such that the keys that are to be ghost-free are connected to key switches in different columns/rows, the present subject matter maximizes the number of keys that can be made ghost free. For instance, using eight GPIO pins, twenty-six keys can be made ghost-free, as explained above. Still further, when the keys of the first set are connected to SRO pins in a controller like EC or keyboard controller, which are present in most computers, the use of a separate microchip for providing ghost-free keys is eliminated. The techniques of the present subject matter can be used in any type of keyboard, such as membrane type keyboard and mechanical type keyboard.

Although implementations of the providing anti-ghosting keys on keyboards have been described in language specific to structural features and/or methods, it is to be understood that the present subject matter is not necessarily limited to the specific features or methods described. Rather, the specific features and methods are disclosed and explained as example implementations.

I claim:

1. A keyboard comprising:
a matrix of electrical interconnections having rows and columns;
key switches arranged at intersections of the rows and columns; and
a first group of keys, each key of the first group of keys to be individually recognized when pressed simultaneously with at least one other key of the first group of keys, the first group of keys comprising a first sub-group of keys and a second sub-group of keys, wherein each key of the first sub-group of keys is connected to a key switch that is to be connected, outside of the matrix, to a general purpose input/output (GPIO) pin of a controller having a plurality of GPIO pins,
the second sub-group of keys comprises at least one key that is not a modifier key, and
keys of the second sub-group of keys are connected to key switches on at least one of: mutually different columns and mutually different rows of the matrix.

2. The keyboard of claim 1, wherein the modifier key is an operating system-defined key for use in hotkey combinations.

3. The keyboard of claim 1, wherein the keyboard is one of a membrane type keyboard and a mechanical type keyboard.

4. The keyboard of claim 1, comprising a second group of keys, each key of the second group of keys connected to key switches of the keyboard matrix.

5. A computing device comprising:
a controller comprising general purpose input/output (GPIO) pins; and
a keyboard comprising:
a keyboard matrix comprising key switches arranged in rows and columns; and
a first set of keys, wherein each key of the first set of keys is connected to a key switch connected to a GPIO pin of the controller and is not connected to the key switches of the keyboard matrix; and
a second set of keys, each key of the second set of keys connected to a key switch of the keyboard matrix, the second set of keys comprising a subset of keys, wherein
the subset of keys comprises at least one key that is a not a modifier key,
each key of the subset of keys is to be individually recognized when pressed simultaneously with at least one other key of the subset of keys, and
keys of the subset of keys are connected to key switches on mutually different columns of the keyboard matrix.

6. The computing device of claim 5, wherein the controller is an embedded controller.

7. The computing device of claim 5, wherein the keyboard matrix comprises key switches arranged in eight rows and eighteen columns.

8. The computing device of claim 5, wherein the first set of keys comprises 'Q', 'W', 'E', 'R', 'A', 'S', 'D', and 'F' keys.

9. The computing device of claim 5, wherein the subset of keys comprises '1', '2', '3', '4', '5', 'G', 'Z', 'C', 'V', 'Ctrl', 'Alt', 'Shift', <Windows>, <Left Arrow>, <Right Arrow>, <Up Arrow>, <Down Arrow>, and <Space>keys.

10. The computing device of claim 5, comprising a recognizer, wherein the recognizer is connected to the keyboard matrix for recognition of a pressed key.

11. A method for providing electrical connections to keys of a keyboard, the method comprising:
connecting keys of a first set of keys to switches that are to be connected to general purpose input/output (GPIO) pins of a controller outsde of a keyboard matrix; and
connecting keys of a second set of keys to switches of the keyboard matrix, the keyboard matrix comprising a plurality of switches arranged in rows and columns, wherein
the second set of keys comprises a subset of keys, a simultaneous pressing of at least two keys of which are to be individually recognized,
the subset of keys comprises at least one key that is not a modifier key, and connecting keys of the second set of keys comprises connecting keys of the subset of keys to switches on at least one of: mutually different columns and mutually different rows.

12. The method of claim 11, comprises connecting the keyboard matrix to a recognizer for recognizing pressed keys.

13. The method of claim 11, wherein keys of the first set of keys and the subset of keys are keys that are frequently used in gaming applications, and wherein the modifier key is an operating system-defined key for use in hotkey combinations.

14. The method of claim 11, comprising:
selecting a plurality of frequently used keys as the first set of keys;
selecting a plurality of keys of the second set of keys that are frequently used in combination with the keys of the first set of keys as the subset of keys; and
determining a mapping between the keys of the second set of keys and the switches of the keyboard matrix such that the keys of the subset of keys are connected to the switches on at least one of: mutually different columns and mutually different rows.

* * * * *